United States Patent
Raghunathan et al.

(10) Patent No.: US 9,678,115 B2
(45) Date of Patent: Jun. 13, 2017

(54) CONTACTLESS VOLTAGE SENSING DEVICES

(71) Applicant: General Electric Company, Schenectady, NY (US)

(72) Inventors: Arun Kumar Raghunathan, Bangalore (IN); Amol Rajaram Kolwalkar, Bangalore (IN); Sameer Dinkar Vartak, Bangalore (IN); Abhijeet Arvind Kulkarni, Pune (IN); Charles Brendan O'Sullivan, Castletroy (IE)

(73) Assignee: General Electric Company, Niskayuna, NY (US)

( * ) Notice: Subject to any disclaimer, the term of this patent is extended or adjusted under 35 U.S.C. 154(b) by 136 days.

(21) Appl. No.: 14/276,175

(22) Filed: May 13, 2014

(65) Prior Publication Data

US 2015/0331017 A1 Nov. 19, 2015

(51) Int. Cl.
*G01R 21/00* (2006.01)
*G01R 19/00* (2006.01)
*G01R 15/06* (2006.01)
*G01R 15/16* (2006.01)

(52) U.S. Cl.
CPC ......... *G01R 19/0084* (2013.01); *G01R 15/06* (2013.01); *G01R 15/16* (2013.01)

(58) Field of Classification Search
CPC .............................. G01R 21/00; G01R 31/302
USPC ....................................................... 324/754
See application file for complete search history.

(56) References Cited

U.S. PATENT DOCUMENTS

| 5,473,244 A | 12/1995 | Libove et al. |
| 5,949,230 A | 9/1999 | Kobayashi et al. |
| 5,963,785 A * | 10/1999 | Katoh ............... H01L 21/76264 |
| | | 257/E21.564 |
| 6,470,283 B1 | 10/2002 | Edel |
| 6,825,649 B2 | 11/2004 | Nakano |
| (Continued) | | |

FOREIGN PATENT DOCUMENTS

| JP | 2002131341 A | 5/2002 |
| WO | 9942844 A1 | 8/1999 |

OTHER PUBLICATIONS

Li et al., "Determination of the Phase Sequence and Voltage Level of Overhead Conductors Using Non-Contact Sensors", Transmission and Distribution Conference and Exhibition: Asia and Pacific, 2005 IEEE/PES, pp. 1-6, 2005.

*Primary Examiner* — Son Le
*Assistant Examiner* — Akm Zakaria
(74) *Attorney, Agent, or Firm* — Nitin N. Joshi

(57) ABSTRACT

A contactless voltage sensing device configured to measure a voltage value of a conductor is provided. The contactless voltage sensing device includes a first impedance element having a first impedance, where the first impedance element is configured to be operatively coupled to the conductor. Further, the contactless voltage sensing device includes an antenna operatively coupled to the first impedance element, a second impedance element having a second impedance, where the second impedance element is formed in part by the antenna and a parasitic impedance element, and where the parasitic impedance element includes a parasitic impedance, and measurement and communication circuitry coupled to the first impedance element to measure the voltage value of the conductor.

19 Claims, 4 Drawing Sheets

(56) References Cited

U.S. PATENT DOCUMENTS

| | | | |
|---|---|---|---|
| 6,917,338 B2* | 7/2005 | Bergervoet | H01Q 3/24 343/702 |
| 7,424,400 B2 | 9/2008 | McCormack et al. | |
| 7,518,529 B2 | 4/2009 | O'Sullivan et al. | |
| 8,493,053 B2 | 7/2013 | De Buda | |
| 8,493,054 B2 | 7/2013 | El-Essawy et al. | |
| 2002/0167303 A1* | 11/2002 | Nakano | G01R 31/312 324/126 |
| 2005/0043055 A1* | 2/2005 | Vance | H01Q 1/243 455/550.1 |
| 2006/0187074 A1* | 8/2006 | O'Sullivan | G01R 15/142 340/660 |
| 2008/0088510 A1* | 4/2008 | Murata | H01Q 3/24 343/700 MS |
| 2010/0283479 A1 | 11/2010 | McCormack et al. | |
| 2010/0308852 A1* | 12/2010 | Unmuessig | G01R 35/00 324/750.3 |
| 2010/0318306 A1 | 12/2010 | Tierney et al. | |
| 2011/0031977 A1 | 2/2011 | O'Sullivan et al. | |
| 2014/0071008 A1* | 3/2014 | Desclos | H01Q 1/243 343/745 |
| 2015/0372371 A1* | 12/2015 | Lagnado | H01Q 1/22 343/720 |

* cited by examiner

CONTACTLESS VOLTAGE SENSING DEVICES

BACKGROUND

Embodiments of the present specification relate to sensing devices, and more particularly to voltage sensing devices.

Recently, deregulation of the electricity supply market has led to increased competition between electricity providers. It is now relatively common for companies and households to have a choice of several different electricity providers when deciding on an electricity provider to supply their electricity needs. This has led to competition between the different providers over matters including pricing and quality of supply. Further, sometimes electricity providers need to supply their customers with less expensive electricity while still assuring the same or improved quality of supply to their customers. In order to achieve these goals the electricity providers have to improve the efficiency of electricity networks or electricity distribution system. Furthermore, due to deregulation, network losses and interruption to electricity supply are now being penalized.

Typically, it has been found that even in highly developed countries, approximately 10% of all electricity generated is lost within the electricity networks themselves. For example, a portion of the electricity being transmitted through a current carrying cable, also referred to as a "power line" of an electricity network may be lost as a result of transmission losses. This figure representing electricity loss within the electricity network rises to almost 25% in less developed nations. This loss of power in the electricity network may be due to undetected faults. Further, these faults may go undetected for long periods of time. Moreover, even when the faults are detected, it is usually challenging to locate the faults over an expansive electricity network. By providing the information of the electrical properties in the electricity network (e.g., by monitoring the electricity networks) in an accurate manner, electricity providers may be able to significantly reduce the amount of electricity lost in the electricity networks and make considerable savings in the cost of generating the electricity. Furthermore, by closely monitoring the electricity networks electricity providers will be in a better position to correct faults in the electricity networks swiftly with a minimum of inconvenience to their customers, thereby providing an improved quality of supply to their customers.

A variety of sensors have been developed for measuring a current in a current carrying cable, such as a current carrying cable in a high voltage electricity distribution system. For example, optical current sensors are used to measure the current in the current carrying cable. The optical current sensors are generally based on the Faraday effect. Some optical current sensors use bulk glass or fiber optic cables that surround the current carrying cable. Although the optical current sensors have a very high dynamic range, however, the optical current sensors require opening the current carrying cable at installation, which may be an expensive procedure.

Other kind of sensors that are used for measuring voltages in the electricity networks may employ metal shells disposed around the current carrying cables. These sensors use the metal shells as capacitance dividers between the current carrying cables and a ground underneath. Among other factors, the capacitance between the shells and the current carrying cables depends on the distance between the shells and the current carrying cables. Accordingly, the metal shells may have limited capacitance between the current carrying cables and the shells themselves because of a limit on a gap between the shells and the current carrying cables. Further, due to the limited capacitance, the sensor may be influenced by changes in surrounding conductors, such as measuring circuits. Moreover, an increase in an area of the shell to increase a capacitance between the shells and the current carrying cables typically results in an increase in a parasitic capacitance of the sensor. The increased parasitic capacitance makes the sensor relatively more prone to fluctuations in the surrounding conductors.

Further, in case of sensors configured to measure voltage values in the power line, the voltage measurement entails physically connecting the voltage measuring device to the voltage line and to the ground. This physical connection between the voltage measuring device and the ground is required to prevent monitored values being undesirably affected by the presence of any object that may exist between the ground and the voltage measuring device. By way of example, a passing vehicle, a tree, an animal, or a bird, or any other object intentionally or unintentionally disposed in close vicinity of the ground and/or the voltage measuring device may result in undesirable changes in the measurement values of the voltage measurement device in absence of the physical connection between the voltage measuring device and the ground. It may be noted that providing this physical connection between the voltage measuring devices and the ground requires complex installation procedures. For example, such installation procedures are both time consuming and labor intensive resulting in an increase in the cost of installing the voltage measuring device. Further, the physical connection to the ground may need to be maintained and periodically checked.

BRIEF DESCRIPTION

In accordance with aspects of the present specification, a contactless voltage sensing device configured to measure a voltage value of a conductor with respect to a reference surface is presented. The contactless voltage sensing device includes a first impedance element having a first impedance, where the first impedance element is configured to be operatively coupled to the conductor. Further, the contactless voltage sensing device includes an antenna operatively coupled to the first impedance element and a second impedance element having a second impedance, wherein the second impedance element is formed in part by the antenna and a parasitic impedance element, and where the parasitic impedance element includes a parasitic impedance. The contactless voltage sensing device further includes measurement and communication circuitry coupled to the first impedance element and configured to measure the voltage of the conductor.

In accordance with another aspect of the present specification, a contactless voltage sensing device configured to measure a voltage value of a conductor with respect to a reference surface is presented. The contactless voltage sensing device includes a first impedance element having a first impedance, where the first impedance element is configured to be operatively coupled to the conductor. Further, the contactless voltage sensing device includes an antenna operatively coupled to the first impedance element and a second impedance element having a second impedance, where the second impedance element is formed in part by the antenna and a parasitic impedance element, and where the parasitic impedance element includes a parasitic impedance. The contactless voltage sensing device further includes measurement and communication circuitry coupled to the first impedance element and configured to measure the voltage value of the conductor. Further, the measurement and communication circuitry is coupled to the first impedance element to measure a voltage of the conductor, where the measurement and control circuitry includes a processor, a monitor, a data acquisition communicator (DAC), or combinations thereof.

In accordance with yet another aspect of the present specification, a monitoring system is presented. The monitoring system includes one or more contactless voltage sensing devices configured to measure a voltage value of a conductor with respect to a reference surface. Further, the contactless voltage sensing device includes a first impedance element having a first impedance, where the first impedance element is configured to be operatively coupled to the conductor. Moreover, the contactless voltage sensing device includes an antenna operatively coupled to the first impedance element, a second impedance element having a second impedance, and measurement and communication circuitry coupled to the first impedance element to measure a voltage of the conductor. Further, the second impedance element is formed in part by the antenna and a parasitic impedance element, where the parasitic impedance element includes a parasitic impedance. Moreover, the monitoring system includes a control unit communicatively coupled to the one or more contactless voltage sensing devices, where the control unit is configured to receive data representative of the voltage value of the conductor from the one or more contactless sensing devices.

DRAWINGS

These and other features, aspects, and advantages of the present specification will become better understood when the following detailed description is read with reference to the accompanying drawings in which like characters represent like parts throughout the drawings, wherein.

Figure 3:
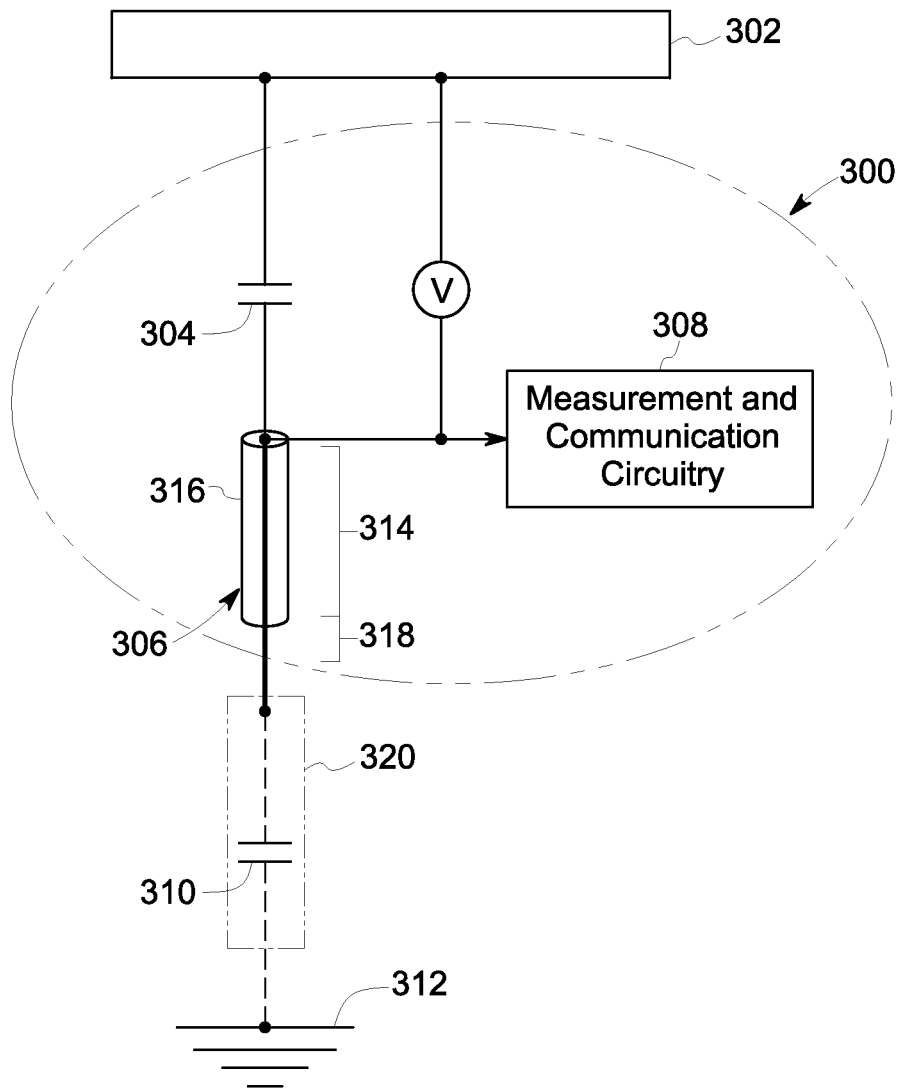
Figure 4:
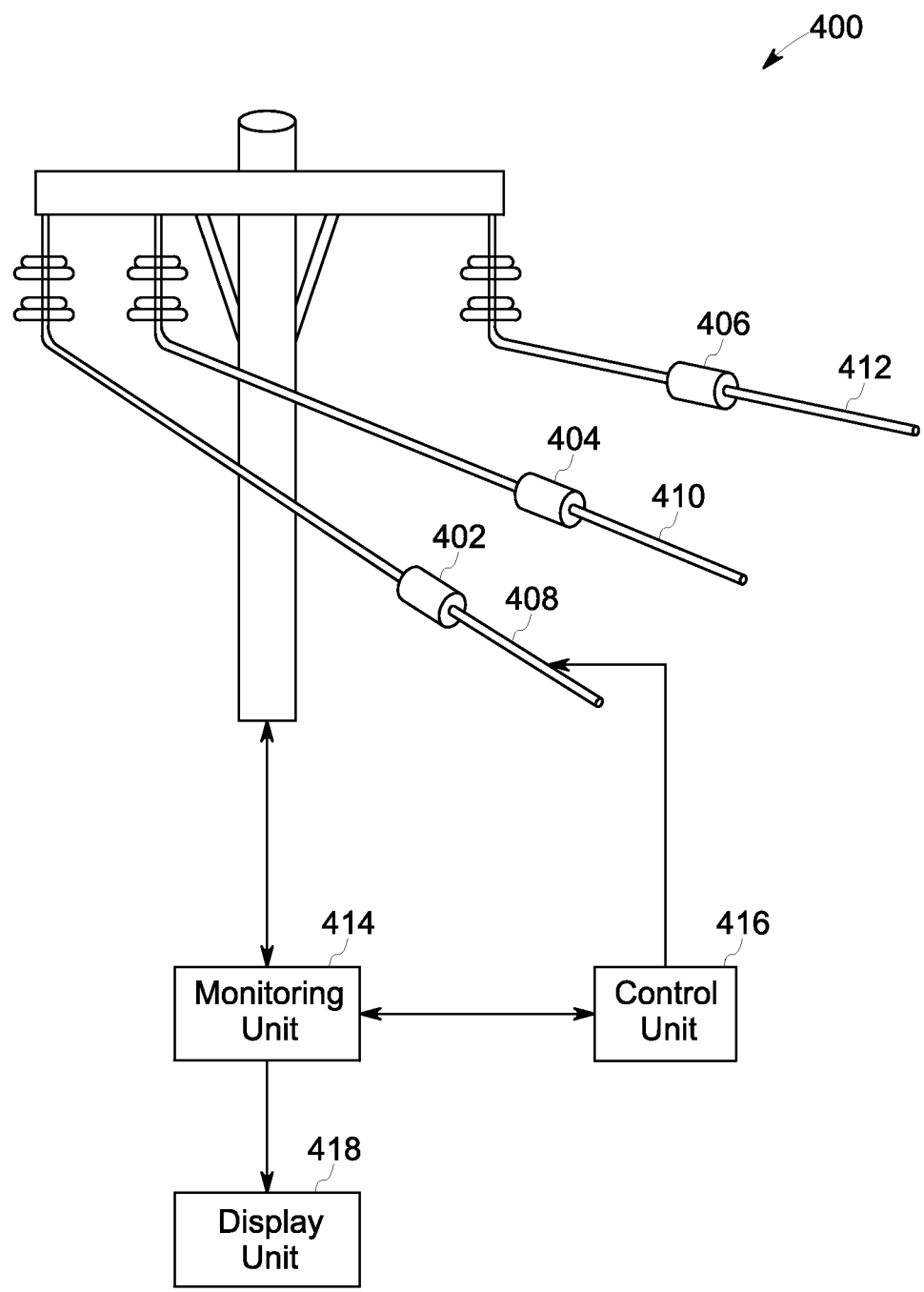

FIG. 3 is a schematic representation of an exemplary contactless voltage sensing device having an antenna, where at least a portion of the antenna is electrically insulated, in accordance with aspects of the present specification; and FIG. 4 is a schematic representation of an exemplary monitoring system employing a contactless voltage sensing device, in accordance with aspects of the present specification.

DETAILED DESCRIPTION

Embodiments of the present specification provide a contactless voltage sensing device configured to measure a voltage value of a conductor with respect to a reference surface. Further, the contactless voltage sensing device may be configured to be physically and operatively coupled to the conductor. As used throughout the present specification, the term "conductor" refers to an electrical conductor. In certain embodiments, the contactless voltage sensing device may be configured to sense one or more electrical parameters from the conductor and measure a voltage value of the conductor with respect to the reference surface based on the sensed electrical parameters. In some embodiments, the conductor may be a power line in an electricity network. In some other embodiments, the conductor may be a bus bar. For example, the conductor may be a bus bar that is disposed in an enclosed switch gear.

As used herein, the term "contactless" refers to absence of direct physical contact between the contactless voltage sensing device and the reference surface. It may be noted that in some embodiments the reference surface may be a ground, however, in some other embodiments, the reference surface may be any other surface other than the ground, where the reference surface has a known potential, referred to as a "reference potential." In a particular example, the contactless voltage sensing device of the present specification is not directly physically coupled to the reference surface (for example, the ground) to provide the reference potential.

In certain embodiments, the contactless voltage sensing device may be used for monitoring a voltage in the power line of the electricity network. In some of these embodiments, the contactless voltage sensing device may be a line mounted device or a pole mounted device. In one example where the contactless voltage sensing device is a line mounted device, the contactless voltage sensing device may be mounted on a power line, such as, but not limited to, a high voltage power line or a medium voltage power line. In a non-limiting example, a voltage of the power line on which the contactless voltage sensing device is disposed may be in a range from about 415 Volts to about 440 kilo-Volts, or higher.

In certain embodiments, the contactless voltage sensing device may include a first impedance element having a first impedance and a second impedance element having a second impedance. The first and second impedances may be used to measure the voltage of the conductor. Non-limiting examples of the first impedance element may include one or more resistors, one or more capacitors, one or more inductors, or combinations thereof. In one example, the contactless voltage sensing device may include a capacitor as the first impedance element. In operation, the first impedance element is configured to sense an electrical parameter, such as the voltage of the conductor.

Further, the contactless voltage sensing device includes an antenna that is operatively coupled to the first impedance element. The antenna is configured to form the second impedance element in conjunction with the parasitic impedance element. In particular, the second impedance element is formed by the antenna and a parasitic impedance element, where the parasitic impedance element is formed between the antenna and the reference surface. An impedance of the second impedance element, also referred to as "second impedance," is a combination of an impedance of the parasitic impedance element, also referred to as "parasitic impedance," and an impedance of the antenna. Further, due to design of the contactless voltage sensing device, in some embodiments, the impedance of the antenna may be negligible compared to the parasitic impedance. In these embodiments, a value of the second impedance may be substantially similar to a value of the parasitic impedance. Accordingly, the second impedance may be substantially a parasitic impedance that appears between the antenna and the reference surface. In a non-limiting example, the parasitic impedance may primarily include a parasitic capacitance.

Further, in certain embodiments, the contactless voltage sensing device includes measurement and communication circuitry, where the measurement and communication circuitry is configured to measure a voltage of the conductor based on the voltage value sensed across the first impedance element. Further, in certain embodiments, the first impedance element may be disposed between a first node and a second node. Similarly, the antenna may be disposed between another first node and another second node. Moreover, the second node of the first impedance element may be operatively coupled to the first node of the antenna. In a particular example, the second node of the first impedance element and the first node of the antenna may be a common node between the first impedance element and the antenna. In operation, the first node of the first impedance element may be maintained at the same potential as that of the conductor. Maintaining the first node of the first impedance element at the same potential as that of the conductor enables the contactless voltage sensing device to measure the voltage of the conductor by enabling a voltage corresponding to the conductor to appear across the first impedance element. Further, the second node of the antenna may be configured to develop a voltage that is different from the voltage of the conductor. The voltage appearing on the second node of the antenna may be caused due to a current flowing through the parasitic impedance element. Consequently, the structure of the contactless voltage sensing device enables the combination of the first and second impedance elements to act as a voltage divider between the conductor and the reference surface. Due to this voltage division between the first and second impedance elements a voltage difference may be created across the first impedance element. Further, the measurement and communication circuitry may be configured to measure this voltage difference appearing across the first impedance element. In some embodiments, the measurement and communication circuitry may be configured to measure the voltage of the conductor based on the values of the first impedance, second impedance and voltage difference appearing across the first impedance element.

In certain embodiments, the contactless voltage sensing device includes an electrically conductive element configured to shield the first impedance element from electromagnetic radiation emanating from the conductor, such as a current carrying power line. Further, in some embodiments, the electrically conductive element may be maintained at the same voltage as that of the conductor.

Moreover, it may be noted that the antenna may be an electrically conductive body that has a first portion and a second portion. Further, an electrical insulator may be disposed on the first portion of the antenna to prevent electrical shorting of the electrically conductive body of the antenna with the electrically conductive element. Additionally, the second portion of the antenna may be disposed outside the electrical insulator as well as the electrically conductive element. The second portion of the antenna that is disposed outside the electrical insulator as well as the electrically conductive element may be exposed to the reference surface. Further, the second portion of the antenna in conjunction with the reference surface may contribute to formation of the second impedance and/or parasitic impedance. In certain embodiments, dimensions of the second portion of the antenna may be selected to facilitate relatively smaller values of antenna impedance as compared to parasitic impedance. The second portion of the antenna acts as the second node of the antenna.

In certain embodiments, the contactless voltage sensing device may be configured to communicate the measured voltage value to a determined location, such as, but not limited to, a control unit, a monitoring unit, a display unit, or combinations thereof. Further, the contactless voltage sensing device may be configured to communicate the measured voltage value using the measurement and communication circuitry. Advantageously, the contactless voltage sensing device may be configured to enable real-time monitoring of the voltage values of the conductor, such as, but not limited to, a power line.

Advantageously, measurement values of the contactless voltage sensing device are not undesirably or adversely affected by presence or absence of electrically conductive or electrically non-conductive objects that may be intentionally or unintentionally disposed between the contactless voltage sensing device and the reference surface while the contactless voltage sensing device is sensing and measuring the voltage values of the power line on which it is disposed. By way of example, the measured voltage value of a power line measured by the contactless voltage sensing device may not be adversely affected due to presence of an electrically conducting body, such as, but not limited to, a stationary or moving vehicle in the vicinity of the power line. Further, the contactless voltage sensing device is relatively easy to install as compared to conventional measurement devices that require a direct physical connection between the measurement device and the ground. In particular, the contactless voltage sensing device is configured to be mounted on the power line without any further need of the contactless voltage sensing device being physically coupled to the ground.

Additionally, one or more contactless voltage sensing devices may be configured to be employed in a monitoring system, where the monitoring system may include the control unit and/or the monitoring unit. The one or more contactless voltage sensing devices may be configured to communicate the measured voltage values of the conductor to the control unit and/or the monitoring unit. In some embodiments, the one or more contactless voltage sensing devices may include a plurality of data acquisition communicators (DACs). In some embodiments, the DACs may form part of the measurement and communication circuitry. In certain embodiments, data representative of the voltage of the power line is communicated by a DAC to the control unit, such as the control center computer, over a global system for mobile communication (GSM) link. This is an inexpensive and secure way of sending the data to the control unit, the monitoring unit, or any other control center computer or device.

Moreover, in some embodiments, the monitoring system may form part of an electricity network. Further, the electrical network may employ one or more monitoring systems. In some of these embodiments, the electricity network may employ a plurality of power lines, a plurality of contactless voltage sensing devices, and one or more monitoring systems. Further, one or more contactless sensing devices of the plurality of contactless voltage sensing devices may be operatively coupled to one or more monitoring systems. In one example, the monitoring system may be configured to communicate the measured voltage values to a control unit in the electricity network. In certain embodiments, the contactless voltage sensing devices may be configured to provide signals representative of the voltage value of a corresponding power line of the electricity network over a wide geographical area in a cost effective way. In one embodiment, each DAC of the plurality of DACs may have one or more contactless voltage sensing devices associated therewith so that the signals representative of the voltage values of the power lines may be transmitted from a contactless voltage sensing device to another contactless voltage sensing device or the control unit of the same or the other monitoring systems. In one example, the electrical properties transmitted from one DAC to the control unit may be transmitted to another DAC before being transferred to the control unit. By having a plurality of DACs, processing may be carried out either at the DACs or in the control unit. In one example, the signals may be amplified in the DAC and temporary storage of the data may be carried out in each DAC.

Further, the contactless voltage sensing device of the present specification may be easily adaptable to different dynamic ranges, bandwidths and sensitivity values. In one embodiment, the first impedance element may be modified to adapt the contactless voltage sensor for the different dynamic ranges, bandwidths and sensitivity values. By way of example, in instances where the first impedance element is a capacitor, a capacitor with higher capacitance may be used to obtain lower bandwidth, and vice versa. In one embodiment, a value of the first capacitance of the first impedance element may be equal to or more than about 1 nF. In the same or different embodiment, a value of the parasitic capacitance from the second impedance element may be less than or equal to about 0.01 pF.

Figure 1:
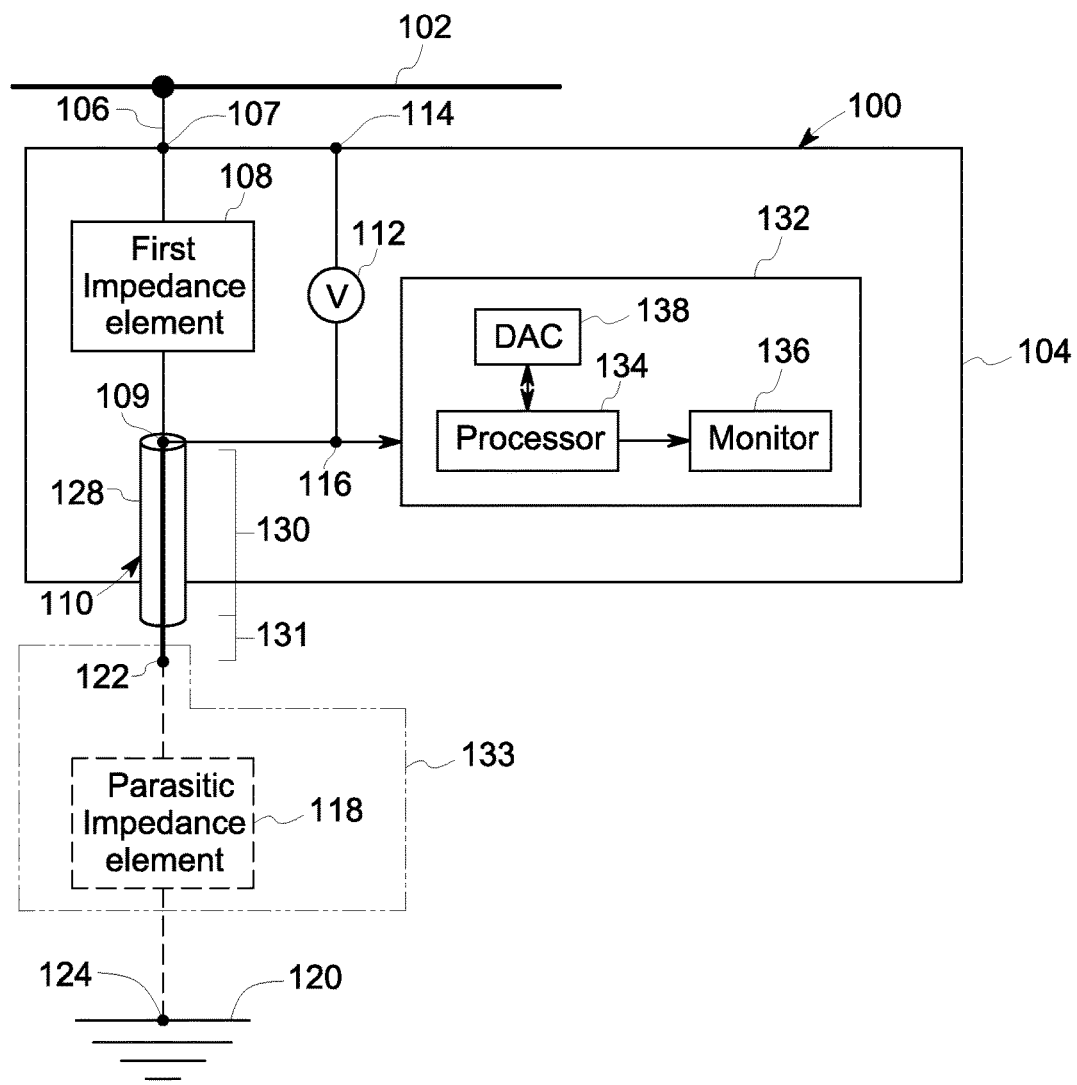
FIG. 1 is a schematic representation of an exemplary contactless voltage sensing device having an electrically conductive housing, in accordance with aspects of the present specification.

FIG. 1 illustrates an exemplary contactless voltage sensing device 100. The contactless voltage sensing device 100 may be configured to measure a voltage value of a conductor, such as, but not limited to, a power line 102 with respect to a reference surface 120. The power line 102 may be a high voltage line, a medium voltage line, or any other power line or any other electrical conductor that is configured to carry electrical current. In certain embodiments, the contactless voltage sensing device 100 includes an electrically conductive element in the form of an electrically conductive housing 104. The electrically conductive housing 104 may be configured to shield one or more components of the contactless voltage sensing device 100 from electromagnetic radiation of the power line 102. Further, the electrically conductive housing 104 may provide shielding to one or more sides of the contactless voltage sensing device 100. In some embodiments, the electrically conductive housing 104 may be maintained at the same voltage as the power line 102. In one embodiment, the electrically conductive housing 104 may be shunted to the power line 102 using an electrically conductive connector 106. Maintaining the electrically conductive housing 104 at the same potential as the power line 102 may facilitate reduction in interference otherwise caused due to presence of the electrical field around the electronic components of the contactless voltage sensing device 100. Further, maintaining the electrically conductive housing 104 at the same potential as that of the power line 102 enhances accuracy of measurement of the contactless voltage sensing device 100.

In the illustrated embodiment, the contactless voltage sensing device 100 further includes a first impedance element 108 disposed between a first node 107 and a second node 109. In some embodiments, the first impedance element 108 may include a capacitor, a resistor, an inductor, or combinations thereof. Further, the first impedance element 108 may have an impedance that is referred to as a "first impedance," hereinafter. The first impedance element 108 is configured to sense at least one electrical parameter of the power line 102. By way of example, a voltage appearing across the first impedance element 108 is representative of the sensed electrical parameter of the power line 102. The first impedance element 108 is connected to the power line 102 at the first node 107.

Further, the first impedance element 108 is operatively coupled to an antenna 110 at the second node 109. The second node 109 is a common node shared between the first impedance element 108 and the antenna 110. Further, the voltage appearing across the first impedance element 108 is representative of the voltage difference that exists between the power line 102 and the second node 109. In embodiments where the electrically conductive housing 104 is maintained at the same voltage as that of the power line 102, the voltage difference between the power line 102 and the second node 109 is the same as the voltage difference between the electrically conductive housing 104 and the second node 109. Accordingly, the voltage difference across the first impedance element 108 may be measured by disposing a voltage sensing device, such as a voltmeter 112, between nodes 114 and 116.

Further, the antenna 110 includes a first portion 130 and a second portion 131. It may be noted that the first and second portions 130 and 131 of the antenna 110 may not be physically different entities. The first portion 130 of the antenna 110 may be the portion of the antenna 110 that is insulated from the electrically conductive housing 104 using an electrical insulator 128. Further, the second portion 131 of the antenna 110 may be the portion that is disposed outside the electrical insulator 128. Further, the second portion 131 of the antenna 110 may be disposed outside the electrically conductive housing 104. Further, the second portion 131 of the antenna 110 may be exposed to the reference surface 120, generally represented by a node 124. In certain embodiments, the node 122 of the antenna 110 is formed on the second portion 131 of the antenna 110. In particular, the antenna 110 is disposed between the node 109, which is the first node of the antenna 110 and a node 122, which is the second node of the antenna 110. Further, the second portion 131 of the antenna 110 is exposed outside the electrical insulator 128.

In the illustrated embodiment, the contactless voltage sensing device 100 includes a second impedance element 133 that is formed by at least a portion of the antenna 110 and a parasitic impedance element 118. In particular, the second impedance element 133 is formed by the second portion 131 of the antenna 110 and the parasitic impedance element 118. Further, the parasitic impedance element 118 is disposed between the antenna 110 and the reference surface 120. In particular, the parasitic impedance element 118 exists between the node 122 of the antenna 110 and the node 124 representative of the reference surface 120. An impedance value of the second impedance element 133 may be referred to as a second impedance. It may be noted that the second impedance is a combination of a parasitic impedance and an impedance of the antenna. Further, it may be noted that the second impedance may be substantially similar to the parasitic impedance as a value of the impedance of the antenna may be substantially lower compared to a value of the parasitic impedance.

Further, in embodiments where the reference surface is a ground, the parasitic impedance may be defined as the parasitic capacitance between the antenna 110 and the ground. However, in other embodiments where the reference surface 120 is a surface different from the ground, the parasitic capacitance may be defined as an impedance between the antenna 110 and a reference potential, where the reference potential is a potential of the reference surface 120.

Additionally, in embodiments where at least a portion of the antenna 110 is disposed in the electrical insulator 128, the overall size of the antenna 110 may not matter, however, only the second portion 131 of the antenna that is disposed outside the electrical insulator 128 may contribute to the parasitic impedance. In some embodiments, a length of the second portion 131 may be up to about 10 cm. Accordingly, it may be desirable to provide the antenna 110 having relatively small dimensions of the second portion 131 to provide relatively high parasitic impedance for the parasitic impedance element. It may be noted that high parasitic impedance or low parasitic capacitance enables the contactless voltage sensing device to be not undesirably influenced by changes in surrounding conductors. Consequently, the increased parasitic impedance renders the contactless voltage sensing device 100 relatively less prone to fluctuations in the surrounding conductors while still maintaining physical separation between the contactless voltage sensing device 100 and the reference surface 120. Further, in some embodiments, the antenna 110 may be a cable, a wire, a plate, a patterned elongated structure, an impedance element, or combinations thereof. In one embodiment, the antenna 110 may include a lumped impedance element. By way of example, the antenna 110 may be a lumped capacitor, where a first terminal of the capacitor is disposed in the electrical insulator 128 and a second terminal of the lumped capacitor is exposed to the reference surface 120.

Further, it may be noted, that the voltage difference ($V_1$) between the nodes 107 and 109 of the first impedance element 108 may appear primarily because of the impedance divider action caused due to the presence of the antenna 110 between the first impedance element 108 and the reference surface 120. In particular, presence of the antenna 110 results in the formation of the second impedance element 133, thereby providing the divided impedance. In one example where the antenna impedance is assumed to be negligible compared to the parasitic impedance, and where the first impedance element 108 is a capacitor, the antenna 110 may result in the formation of the parasitic capacitor. Further, in this example, the first impedance element 108 or the capacitor may act as a voltage divider between the power line 102 and the reference surface 120.

In one embodiment, the second impedance may be at least about 50 times higher than the value of the first impedance. In another embodiment, the second impedance may be at least about 100 times higher than the value of the first impedance. In yet another embodiment, the second impedance is about 100 to 10,000 times higher than the value of the first impedance. In some embodiments, the second impedance may have a relatively high value by virtue of having a high parasitic impedance, a high antenna impedance, or both. In some other embodiments, the second impedance may have a relatively high value by virtue of having a high parasitic impedance. While the value of the first impedance is primarily governed by the type of device that is used as the first impedance element, the parasitic impedance is primarily governed by the size of the antenna 110. Further, the value of the antenna impedance may be governed by the impedance element used to form the antenna 110. In order to have a relatively low value for the first impedance, in some embodiments, a lumped capacitor may be used as the first impedance element 108.

In some embodiments, the voltage in the power line 102 may be calculated using the value of the first impedance, second impedance, and the voltage difference across the first impedance element 108. The voltage of the power line may be represented by Equation (1)

$$V_L = \frac{Z_1 + Z_2}{Z_1} \cdot V_0 \quad \quad \text{Equation (1)}$$

where $V_L$ represents voltage of the power line 102 with respect to reference surface 120, $V_o$ represents voltage difference across the first impedance element, $Z_1$ represents the first impedance value, and $Z_2$ represents the second impedance value. The voltage value across the first impedance element 108 may be governed by the voltage of the power line 102, however, the value of the second impedance may be governed by the antenna impedance, size of the antenna 110 disposed outside the electrical insulator 128, and the distance between the antenna 110 and the reference surface 120. It is desirable to have minimum variation in the value of the parasitic impedance. Due to the small size of the antenna 110, the value of the parasitic impedance is relatively high. Hence, advantageously, the variation in the estimated value of the voltage ($V_L$) of the power line 102 is minimized. Accordingly, presence of conductors or other objects between the contactless voltage sensing device 100 and the ground 120 does not adversely affect the measurement of the voltage values in the power line 102.

In certain embodiments, the output of the voltmeter 112 may be operatively coupled to measurement and communication circuitry 132. In some embodiments, the measurement and communication circuitry 132 may include a processor 134, a monitor 136 and a DAC 138. The measurement and communication circuitry 132 is configured to measure the voltage difference across the first impedance element 108. Further, the processor 134 of the measurement and communication circuitry 132 is configured to determine a voltage value of the power line 102 based on the value of the first impedance, a value of the voltage appearing across the first impedance element 108 and the value of the second impedance. In a non-limiting example, a calibration factor may be used to derive actual voltage value of the power line 102 from the measured voltage value. By way of example, the calibration factor may be derived using the voltage drop across the first impedance element 108. The determined value of the actual voltage of the power line 102 may be monitored using the monitor. Further, the determined value of the actual voltage of the power line 102 may be wirelessly communicated to other contactless voltage sensing devices (not shown) or a control unit using the DAC 138

Also, the functions of the processor 134 may be implemented in a variety of programming languages, including but not limited to Ruby, Hypertext Pre-processor (PHP), Perl, Delphi, Python, C, C++, or Java. Such code may be stored or adapted for storage on one or more tangible, machine-readable media, such as on data repository chips, local or remote hard disks, optical disks (that is, CDs or DVDs), solid-state drives, or other media, which may be accessed by the processor-based system to execute the stored code.

In one embodiment, the measurement and communication circuitry 132 may be a high input impedance circuitry. The measurement and communication circuitry 132 may be configured to use the values of the first impedance and the parasitic impedance to determine the actual voltage value of the power line 102. In the illustrated embodiment, the measurement and communication circuitry 132 may be disposed in the electrically conductive housing 104. However, in an alternate embodiment not illustrated here, the measurement and communication circuitry 132 may be disposed outside the electrically conductive housing 104.

The measurement and communication circuitry 132 is communicatively coupled to other devices, such as a control unit (not shown), or other contactless voltage sensing devices using the DAC 138. In one embodiment, the control unit may be configured to receive data representative of the voltage value of the power line 102 from the one or more contactless sensing devices 100.

In some embodiments, the measurement and communication circuitry 132 may be configured to provide a determined voltage value of the power line 102 to the control unit. In one embodiment, the measurement and communication circuitry 132 may be configured to communicate with the control unit using a DAC 138 or a radio transmitter/receiver. In certain embodiments, the contactless voltage sensing device 100 may be a remote sensing device. The term "remote sensing device" may be used to refer to a sensing device that is communicatively coupled to a monitoring unit and/or a control unit while being located in a remote location with respect to the monitoring unit and/or the control unit. In one embodiment, the remote sensing device may be wirelessly coupled to the monitoring unit and/or the control unit.

Moreover, although not illustrated, the contactless voltage sensing device 100 may include a protective cover or casing that is disposed around at least a portion of the electrically conductive housing 104. The protective cover may be made of electrically non-conductive materials, such as but not limited to, electrically non-conductive polymers or electrically non-conductive ceramics. Further, in one embodiment, the protective cover may be configured to provide mechanical strength and/or environmental protection to the contactless voltage sensing device 100.

Figure 2:
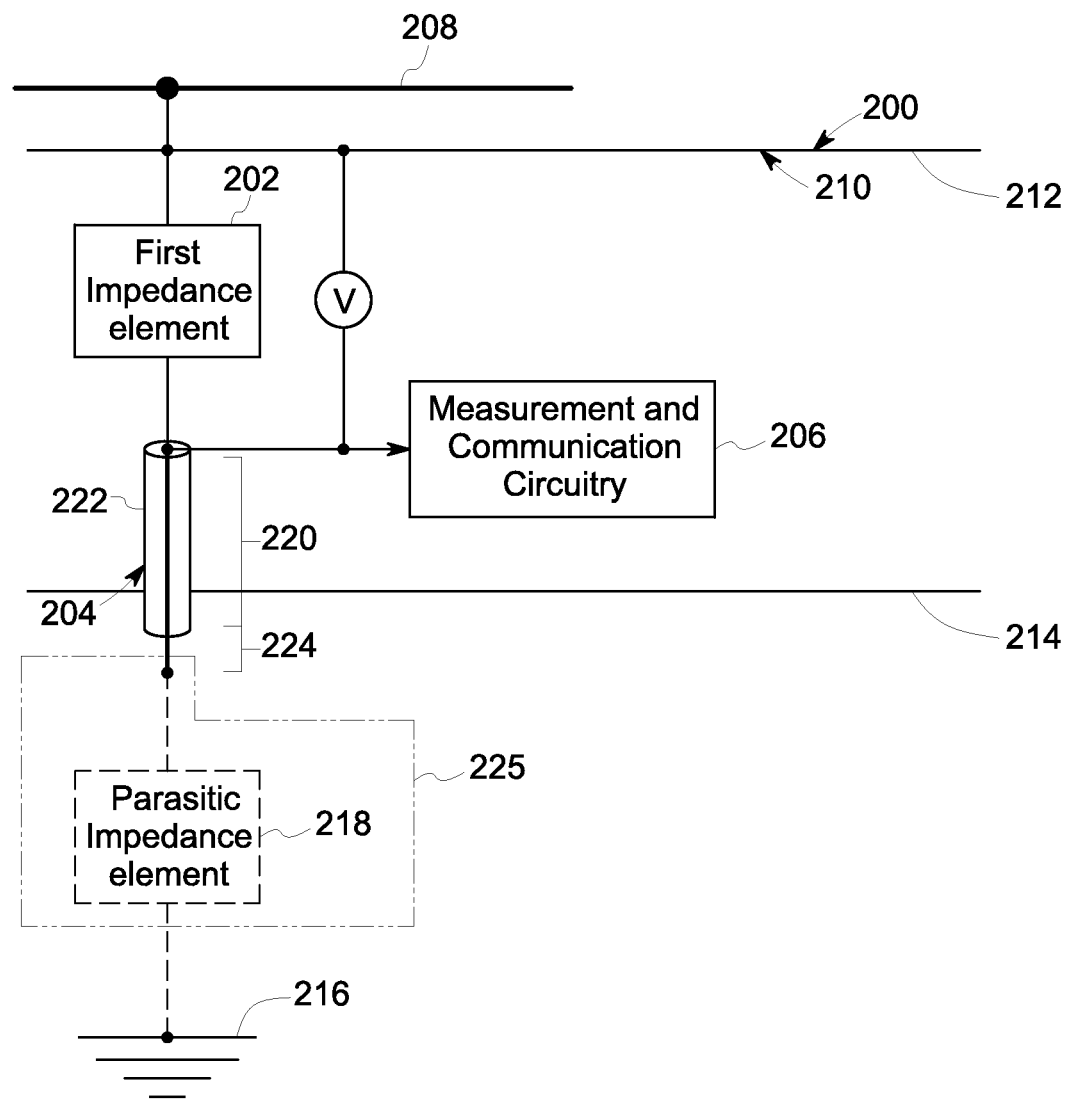
FIG. 2 is a schematic representation of an exemplary contactless voltage sensing device having an electrically conductive shield, in accordance with aspects of the present specification.

FIG. 2 illustrates an alternate embodiment of the contactless voltage sensing device 100 of FIG. 1. In the illustrated embodiment, the contactless voltage sensing device 200 is operatively coupled to a power line 208 and configured to measure a voltage of the power line 208. The contactless voltage sensing device 200 includes a first impedance element 202, an antenna 204 and measurement and communication circuitry 206. The contactless voltage sensing device 200 may be configured to be mounted on the power line 208. Further, the contactless voltage sensing device 200 may include an electrically conductive element in the form of an electrically conductive shield 210. The electrically conductive shield 210 includes a first portion, namely a first electrically conductive shield 212, and a second portion, namely a second electrically shield 214. The first electrically conductive shield 212 of the electrically conductive shield 210 is disposed between the first impedance element 202 and the power line 208. Accordingly, the first electrically conductive shield 212 is configured to shield the contactless voltage sensing device 200 from the electromagnetic radiation from the power line 208. Further, the second electrically conductive shield 214 of the electrically conductive shield 210 is disposed between the antenna 204 and a reference surface 216. The second electrically conductive shield 214 is configured to prevent any electrical interference between the reference surface 216 and the first impedance element 202. Further, the second electrically conductive shield 214 may be configured to enable the formation of a second impedance element 225. In particular, the second impedance element 225 may be formed in part by the antenna 204 and a parasitic impedance element 218. Further, the parasitic impedance element 218 may be disposed between the antenna 204 and the reference surface 216.

Further, the antenna 204 includes a first portion 220, a second portion 224 and an electrical insulator 222. The first portion 220 of the antenna 204 may be disposed in the electrical insulator 222, whereas the second portion of the antenna second 204 may be disposed outside the electrical insulator 222. The second portion 224 of the antenna 204 may be disposed on the same side of the second electrically conductive shield 214 as the reference surface 216. The second portion 224 of the antenna 204 in conjunction with the reference surface 216 may form the parasitic impedance element 218.

Further, the first and second electrically conductive shields 212 and 214 may both be maintained at the same electrical potential as that of the power line 208. Although not illustrated in certain embodiments, the electrically conductive shield 210 may include only one of the first or second electrically conductive shields 212 and 214. In one example, the electrically conductive shield 210 may include only the first electrically conductive shield 212.

FIG. 3 illustrates a contactless voltage sensing device 300 configured to measure a voltage value of a conductor 302 with respect to a reference surface 312. The contactless voltage sensing device 300 includes a first impedance element, such as a capacitor 304, an antenna 306 and measurement and communication circuitry 308. The measurement and communication circuitry 308 is configured to measure a voltage value based on one or more electrical parameters sensed by the capacitor 304 and a second impedance element 320. In the illustrated embodiment, it is assumed that an antenna impedance is substantially lower than a parasitic capacitance. Accordingly, the parasitic capacitance is substantially similar to the second impedance. Further, the parasitic capacitance may be sensed across a parasitic capacitor 310 formed between the antenna 306 and the reference surface 312. In the illustrated embodiment, the capacitor 304 is shown as a single or lumped capacitor, however, in an alternative embodiment; a plurality of capacitors may be used to replace the capacitor 304. In some of these embodiments, the plurality of capacitors may be electrically coupled to effectively form a lumped capacitor. Further, the antenna 306 may include a portion 314 that is disposed within an electrical insulator 316, and a portion 318 that is disposed outside the electrical insulator 316. The portion 318 disposed outside the electrical insulator 316 forms a parasitic capacitor 310 in conjunction with the reference surface 312.

FIG. 4 illustrates an exemplary embodiment of a monitoring system 400 employed in an electricity network in accordance with aspects of the present specification. In the illustrated embodiment, power lines 408, 410 and 412 may be operatively coupled to a common electric pole to form part of a larger electricity network. The monitoring system 400 includes 3 contactless voltage sensing devices 402, 404 and 406 disposed on their respective power lines 408, 410 and 412, respectively. The contactless voltage sensing devices 402, 404 and 406 may individually measure the voltages on their respective power lines 408, 410 and 412. Once the voltage values have been measured the contactless voltage sensing devices 402, 404 and 406 may communicate the measured voltage values to a monitoring unit 414, such as a central computer. In instances where the contactless voltage sensing devices 402, 404 and 406 communicate with the monitoring unit 414, the monitoring unit 414 may be configured to transmit the data to a control unit 416 to perform required steps, when required. By way of example, in case a fluctuation or drop or rise is monitored in the voltage values of one or more power lines 408, 410 and 412, the corresponding contactless voltage sensing devices 402, 404 and 406 may communicate with the monitoring unit 414 to transmit the data to a control unit 416 to perform corrective measures.

In certain embodiments, each contactless sensing device 402, 404 and 406 may include a corresponding processor (not shown in FIG. 4). In some of these embodiments, the corresponding processors may be configured to communicate with each other. In this way, the processing of the measured voltage may be carried out at each of the contactless voltage sensing devices 402, 404 and 406 which reduces the computational overhead requirement of the control unit 416 and may further enhance the efficiency of the monitoring system 400. Further, in addition to individual processors of the contactless voltage sensing devices 402, 404 and 406, the monitoring system 400 may include a processor unit (not shown in FIG. 4) disposed between one or more of the contactless voltage sensing devices 402, 404 and 406 and the monitoring unit 414 or the control unit 416. The processor unit may be configured to process the data received from the contactless voltage sensing devices 402, 404 and 406 before transmitting the data to the monitoring unit 414 or the control unit 416. Alternatively, in some other embodiments, the monitoring system 400 may include a common processor unit between the contactless sensing devices 402, 404 and 406 for processing the measured electrical signals from the one or more contactless voltage sensing devices 402, 404 and 406 and transmitting the processed data to the control unit 416.

In some embodiments, the monitoring unit 414, the control unit 416, or both may be configured to store the requested information in a storage repository (not shown). In one embodiment, the storage repository may include devices such as a hard disk drive, a floppy disk drive, a compact disk-read/write (CD-R/W) drive, a Digital Versatile Disc (DVD) drive, a flash drive, and/or a solid-state storage device.

Further, in certain embodiments, the monitoring system 400 may include a display unit 418. In some embodiments, the display unit 418 may form part of the monitoring unit 414 or the control unit 416. In certain embodiments, two or more contactless voltage sensing devices 402, 404 and 406 may be disposed along a length of the power lines 408, 410 and 412.

In a non-limiting example, a distance between any two adjacent contactless voltage sensing devices disposed on the same power line may be about 1 kilometer. Further, distances between any two adjacently disposed contactless voltage sensing devices 402, 404 and 406 may be the same or different for the same power line. Data representative of the voltage of the power line from one or more contactless voltage sensing devices 402, 404 and 406 may be measured and/or processed by one or more monitoring units 418 before sending the data to the control unit 416. In one embodiment, the data may be transmitted from the contactless voltage sensing device to one or more monitoring units 418 via a DAC (not shown), where the DAC may form part of the contactless voltage sensing devices 402, 404 and 406. In some embodiments, the monitoring system 400 may include an additional DAC unit in addition to the individual DAC units corresponding to the contactless voltage sensing devices 402, 404 and 406. In these embodiments, the DAC unit may be configured to execute calculations on the data received from one or more contactless voltage sensing devices 402, 404 and 406 to estimate the overall state of power lines 408, 410 and along the length of power lines 408, 410 and 412. In some of these embodiments, the DAC unit may form part of the individual processors or the common processor unit to process the data representative of the electrical properties of the power line, prior to transmitting the data onwards to the control unit 416. In this way, the computation may be carried out in each of the DACs which may help in simplifying the construction of the individual measurement sensors. Depending on the line conditions of power lines 408, 410 and 412 and the distribution of branches and loads on the line, various combinations of contactless voltage sensing devices 402, 404 and 406 may be employed on power lines 408, 410 and 412.

In certain embodiments, the one or more contactless voltage sensing devices 402, 404 and 406 may be configured to be powered directly from the power line upon which it is mounted. Further, in one embodiment, the one or more contactless voltage sensing devices 402, 404 and 406 may be configured to draw operating power directly from a magnetic field of the power line.

Further, it may be noted that the DACs of the individual contactless voltage sensing devices 402, 404 and 406 may or may not be in direct communication link with the control unit 416 or the monitoring unit 414. Moreover, any number of repeater units or other monitoring units may be used to repeat the signal from the contactless voltage sensing devices 402, 404 and 406 en route to the control unit 416.

Further, the position of each of the contactless voltage sensing devices 402, 404 and 406 may be obtained using standard global positioning systems (GPS), for example, during installation of the contactless voltage sensing devices 402, 404 and 406. This may then in turn be used in whole or in part as the address of that particular contactless voltage sensing device. The position of the contactless voltage sensing devices 402, 404 and 406 may be used to direct engineers to the particular contactless voltage sensing device to further facilitate the ability of the service personnel to determine the location of a fault. Moreover, the measurements obtained from the different power lines may be time-synchronized. In some embodiments, the GPS signals may be used for time synchronizing the measurements across the contactless voltage sensing devices 402, 404 and 406.

In case of three phase lines, the contactless voltage sensing devices may be disposed on one or more of the three phase lines. In an example embodiment, voltage values from the three phase lines as sensed by the contactless voltage sensing devices may be summed using complex arithmetic. In certain embodiments, if a fault condition exists on a power line, current and voltage values of the power line may be used to determine a location of the fault on the power line. In some embodiments, the voltage sensor of the present specification may be integrated with a current sensor. In these embodiments, the integrated sensor may be used to provide both the current and voltage values to determine the location of the fault on the power line.

Once the fault location or the fault condition is identified, in some embodiments, repair personnel may be alerted using a mobile communication device, such as, but not limited to, a cell phone, a pager, and it will be understood that various other methods of altering the repair personnel such as by GSM network may be used.

Furthermore, it may be noted that in some embodiments, each contactless voltage sensing device may be electrically isolated from the reference surface (e.g., a ground) and therefore may be relatively simple to install on a power line. Various different measurements may be taken from the overhead power lines by the addition of further measurement equipment.

Additionally, in certain embodiments, one or more contactless voltage sensing devices may be configured to be powered directly from the power line upon which it is mounted. By way of example, the one or more contactless voltage sensing devices may be configured to draw operating power directly from the magnetic field of the power line.

Advantageously, the contactless voltage sensing device of the present application is configured to perform voltage measurement of the high voltage lines without requiring a physical connection of the contactless voltage sensing device to the ground or between lines making the installation and operation of the sensor easy. Further, the contactless voltage sensing device provides solution to the problem of undesirable influence of changes in surroundings of the contactless voltage sensing device on the measured values.

While only certain features of the disclosure have been illustrated and described herein, many modifications and changes will occur to those skilled in the art. It is, therefore, to be understood that the appended claims are intended to cover all such modifications and changes as fall within the true spirit of the disclosure.

The invention claimed is:

1. A contactless voltage sensing device configured to measure a voltage value of a conductor with respect to a voltage potential at a reference surface, said contactless voltage sensing device comprising:
    a first impedance element having a first impedance value, wherein said first impedance element is configured to be operatively coupled to the conductor;
    an antenna operatively coupled to said first impedance element;
    only one parasitic impedance element having a parasitic impedance value, wherein said only one parasitic impedance element is formed between said antenna and the reference surface;
    a second impedance element having a second impedance value, wherein said second impedance element is formed in part by said antenna and said only one parasitic impedance element, and wherein the second impedance value is higher than the first impedance value by a multiple of about 50 (fifty) to about 10,000 (ten thousand); and
    measurement and communication circuitry coupled to said first impedance element and configured to measure the voltage value of the conductor.

2. The contactless voltage sensing device of claim 1 further comprising an electrically conductive element disposed between said first impedance element and the conductor, said electrically conductive element configured to provide shielding on one or more sides of said first impedance element.

3. The contactless voltage sensing device of claim 2, wherein said electrically conductive element comprises one or more of an electrically conductive housing and one or more electrically conducive shields.

4. The contactless voltage sensing device of claim 2, wherein said electrically conductive element is maintained at a same voltage value as the conductor.

5. The contactless voltage sensing device of claim 2, wherein said electrically conductive element is operatively coupled to the conductor.

6. The contactless voltage sensing device of claim 2, wherein said antenna comprises a first portion and a second portion, and wherein the reference surface and said second portion of said antenna are disposed on a same side of said electrically conductive element.

7. The contactless voltage sensing device of claim 1, wherein said antenna comprises a first portion and a second portion, and wherein an electrical insulator is disposed on said first portion of said antenna.

8. The contactless voltage sensing device of claim 7, wherein a length of said second portion of said antenna is less than about 10 cm.

9. The contactless voltage sensing device of claim 1, wherein the second impedance value is a combination of an antenna impedance value of said antenna and the parasitic impedance value.

10. The contactless voltage sensing device of claim 1, wherein the parasitic impedance value is at least about 50 times higher than the first impedance value.

11. The contactless voltage sensing device of claim 1, wherein said first impedance element comprises a capacitor, an inductor, a resistor, or combinations thereof.

12. The contactless voltage sensing device of claim 1, wherein said contactless voltage sensing device is not directly physically coupled to the reference surface.

13. The contactless voltage sensing device of claim 1, wherein said measurement and communication circuitry comprises one or more of a processor, a monitor, and a data acquisition communicator (DAC).

14. A contactless voltage sensing device configured to measure a voltage value of a conductor with respect to a voltage potential at a reference surface, said contactless voltage sensing device comprising:
    a first impedance element having a first impedance value, wherein said first impedance element is configured to be operatively coupled to the conductor;
    an antenna operatively coupled to said first impedance element;
    only one parasitic impedance element having a parasitic impedance value, wherein said only one parasitic impedance element is formed between said antenna and the reference surface;
    a second impedance element having a second impedance value, wherein said second impedance element is formed in part by said antenna and said only one parasitic impedance element, and wherein the second impedance value is higher than the first impedance value by a multiple of about 50 (fifty) to about 10,000 (ten thousand); and
    measurement and communication circuitry coupled to said first impedance element and configured to measure the voltage value of the conductor, wherein said measurement and communication circuitry comprises one or more of a processor, a monitor, and a data acquisition communicator (DAC).

15. A monitoring system, comprising:
    one or more contactless voltage sensing devices configured to measure a voltage value of a conductor with respect to a voltage potential at a reference surface, said one or more contactless voltage sensing devices comprising:
        a first impedance element having a first impedance value, wherein the first impedance element is configured to be operatively coupled to the conductor;
        an antenna operatively coupled to said first impedance element;
        only one parasitic impedance element having a parasitic impedance value, wherein said only one parasitic impedance element is formed between said antenna and the reference surface;
        a second impedance element having a second impedance value, wherein said second impedance element is formed in part by said antenna and said only one parasitic impedance element, and wherein the second impedance value is higher than the first impedance value by a multiple of about 50 (fifty) to about 10,000 (ten thousand);

measurement and communication circuitry coupled to said first impedance element and configured to measure the voltage value of the conductor with respect to the reference surface;

a monitoring unit communicatively coupled to said one or more contactless voltage sensing devices; and a control unit coupled to at least one of said measurement and communication circuitry, said one or more contactless voltage sensing devices, and said monitoring unit, wherein said control unit is configured to receive data representative of the voltage value of the conductor from said one or more contactless voltage sensing devices.

16. The monitoring system of claim 15, wherein said one or more contactless voltage sensing devices comprise a data acquisition communicator (DAC), and wherein the value of the voltage of the conductor is transmitted from said DAC to said control unit using a global system for mobile communication (GSM) link.

17. The monitoring system of claim 15 further comprising a plurality of monitoring units, wherein each monitoring unit of said plurality of monitoring units is configured to act as a repeater for another monitoring unit of said plurality of monitoring units.

18. The monitoring system of claim 15, wherein the conductor is a power line, and wherein said one or more contactless voltage sensing devices are configured to be powered directly from a respective power line upon which said one or more contactless voltage sensing devices are mounted.

19. The monitoring system of claim 18, wherein said one or more contactless voltage sensing devices are configured to draw operating power directly from a magnetic field of the power line.

* * * * *